(12) United States Patent
Arima et al.

(10) Patent No.: US 11,699,766 B2
(45) Date of Patent: Jul. 11, 2023

(54) SCHOTTKY BARRIER DIODE

(71) Applicant: TDK Corporation, Tokyo (JP)

(72) Inventors: Jun Arima, Tokyo (JP); Jun Hirabayashi, Tokyo (JP); Minoru Fujita, Tokyo (JP); Katsumi Kawasaki, Tokyo (JP); Daisuke Inokuchi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/646,074

(22) PCT Filed: Aug. 30, 2018

(86) PCT No.: PCT/JP2018/032086
§ 371 (c)(1),
(2) Date: Mar. 10, 2020

(87) PCT Pub. No.: WO2019/049764
PCT Pub. Date: Mar. 14, 2019

(65) Prior Publication Data
US 2020/0287060 A1    Sep. 10, 2020

(30) Foreign Application Priority Data

Sep. 11, 2017  (JP) ................................ 2017-173804

(51) Int. Cl.
*H01L 29/24* (2006.01)
*H01L 29/872* (2006.01)

(52) U.S. Cl.
CPC .......... *H01L 29/8725* (2013.01); *H01L 29/24* (2013.01)

(58) Field of Classification Search
CPC combination set(s) only.
See application file for complete search history.

(56) References Cited

U.S. PATENT DOCUMENTS

2005/0184355 A1   8/2005 Okada
2010/0207205 A1*  8/2010 Grebs ............... H01L 29/66143
                                                257/334

(Continued)

FOREIGN PATENT DOCUMENTS

CN    103579371 A    2/2014
JP    2011-142123 A  7/2011

(Continued)

OTHER PUBLICATIONS

International Search Report issued in International Patent No. PCT/JP2018/032086, dated Oct. 2, 2018, with English translation.

(Continued)

*Primary Examiner* — Moin M Rahman
(74) *Attorney, Agent, or Firm* — McDermott Will & Emery LLP

(57) ABSTRACT

An object of the present invention is to provide a Schottky barrier diode which is less likely to cause dielectric breakdown due to concentration of an electric field. A Schottky barrier diode includes a semiconductor substrate 20 made of gallium oxide, a drift layer 30 made of gallium oxide and provided on the semiconductor substrate 20, an anode electrode 40 brought into Schottky contact with the drift layer 30, and a cathode electrode 50 brought into ohmic contact with the semiconductor substrate 20. The drift layer 30 has an outer peripheral trench 10 formed at a position surrounding the anode electrode 40 in a plan view. An electric field is dispersed by the presence of the outer peripheral trench 10 formed in the drift layer 30. This alleviates concentration of the electric field on the corner of the anode electrode 40, making it unlikely to cause dielectric breakdown.

12 Claims, 7 Drawing Sheets

(56) References Cited

U.S. PATENT DOCUMENTS

| | | | |
|---|---|---|---|
| 2011/0163409 A1 | 7/2011 | Mizushima et al. | |
| 2012/0018836 A1* | 1/2012 | Nagai | H01L 29/8725 257/471 |
| 2012/0153386 A1* | 6/2012 | Hirler | H01L 29/872 257/334 |
| 2013/0069109 A1 | 3/2013 | Matsuda et al. | |
| 2013/0307111 A1 | 11/2013 | Mizushima et al. | |
| 2014/0175457 A1* | 6/2014 | Yen | H01L 29/1608 257/77 |
| 2014/0239452 A1* | 8/2014 | Sasaki | H01L 29/045 257/613 |
| 2014/0312452 A1 | 10/2014 | Lin | |
| 2015/0228809 A1* | 8/2015 | Sugiura | H01L 29/872 257/485 |
| 2016/0043238 A1 | 2/2016 | Takizawa et al. | |
| 2016/0254357 A1 | 9/2016 | Aketa | |
| 2016/0322467 A1 | 11/2016 | Takizawa et al. | |
| 2017/0200790 A1 | 7/2017 | Hitora et al. | |

FOREIGN PATENT DOCUMENTS

| | | |
|---|---|---|
| JP | 2013-102081 A | 5/2013 |
| JP | 2013-140824 A | 7/2013 |
| JP | 2017-045969 A | 3/2017 |
| JP | 2017-135175 A | 8/2017 |
| WO | 2016/013554 | 1/2016 |

OTHER PUBLICATIONS

Kohei Sasaki et al., "Ga2O3 Schottky Barrier Diode with Trench MOS Structure," Novel Crystal Tech, et al., 2017.

Extended European Search Report issued in corresponding European Patent Application No. 18854107.2-1212, dated May 11, 2021.

K. Sasaki et al.,"First Demonstration of Ga2O3 Trench MOS-Type Schottky Barrier Diodes", IEEE Electron Device Letters, IEEE, USA, vol. 38, No. 6, Jun. 1, 2017 (Jun. 1, 2017), pp. 783-785.

\* cited by examiner

SCHOTTKY BARRIER DIODE

CROSS-REFERENCE OF RELATED APPLICATIONS

This application is the U.S. National Phase under 35 U.S.C. § 371 of International Patent Application No. PCT/JP2018/032086, filed on Aug. 30, 2018, which in turn claims the benefit of Japanese Patent Application No. 2017-173804, filed on Sep. 11, 2017, the entire disclosures of which Applications are incorporated by reference herein.

TECHNICAL FIELD

The present invention relates to a Schottky barrier diode and, more particularly, to a Schottky barrier diode using gallium oxide.

BACKGROUND ART

A Schottky barrier diode is a rectifying element utilizing a Schottky barrier generated due to bonding between metal and a semiconductor and is lower in forward voltage and higher in switching speed than a normal diode having a PN junction. Thus, the Schottky barrier diode is sometimes utilized as a switching element for a power device.

When the Schottky barrier diode is utilized as a switching element for a power device, it is necessary to ensure a sufficient backward withstand voltage, so that, silicon carbide (SiC), gallium nitride (GaN), or gallium oxide ($Ga_2O_3$) having a larger band gap is sometimes used in place of silicon (Si). Among them, gallium oxide has a very large band gap (4.8 eV to 4.9 eV) and a large breakdown field (7 MV/cm to 8 MV/cm), so that a Schottky barrier diode using gallium oxide is very promising as the switching element for a power device. An example of the Schottky barrier diode using gallium oxide is described in Patent Document 1 and Non-Patent Document 1.

In the Schottky barrier diode described in Non-Patent Document 1, a plurality of trenches are formed so as to overlap an anode electrode in a plan view, and the inner wall of each of the trenches is covered with an insulating film. With this structure, when a backward voltage is applied, a mesa region positioned between adjacent trenches becomes a depletion layer, so that a channel region of a drift layer is pinched off. Thus, a leak current upon application of the backward voltage can be significantly reduced.

CITATION LIST

Patent Document

[Patent Document 1] JP 2017-045969 A

Non-Patent Document

[Non-Patent Document 1] $Ga_2O_3$ Schottky Barrier Diode with Trench MOS Structure (The 64th Spring Meeting of the Japan Society of Applied Physics, 2017 [15p-315-13])

SUMMARY OF INVENTION

Problem to be Solved by the Invention

However, in the Schottky barrier diodes described in Patent Document 1 and Non-Patent Document 1, an electric field concentrates on the end portion of the anode electrode, so that when a high voltage is applied, dielectric breakdown occurs in this portion. For example, in the Schottky barrier diodes described in Non-Patent Document 1, an electric field concentrates on an edge part of the trench positioned at the end portion.

It is therefore an object of the present embodiment to provide a Schottky barrier diode using gallium oxide, which is less likely to cause dielectric breakdown due to concentration of an electric field.

Means for Solving the Problem

A Schottky barrier diode according to the present invention includes: a semiconductor substrate made of gallium oxide; a drift layer made of gallium oxide and provided on the semiconductor substrate; an anode electrode brought into Schottky contact with the drift layer; and a cathode electrode brought into ohmic contact with the semiconductor substrate. The drift layer has an outer peripheral trench formed at a position surrounding the anode electrode in a plan view.

According to the present invention, an electric field is dispersed by the presence of the outer peripheral trench formed in the drift layer. This alleviates concentration of the electric field on the corner of the anode electrode, making it unlikely to cause dielectric breakdown.

The Schottky barrier diode according to the present invention may further include an insulator embedded in the outer peripheral trench. This enhances an electric field dispersion effect.

In the present invention, the drift layer may further have a plurality of center trenches formed at a position overlapping the anode electrode in a plan view. In this case, the inner wall of each of the plurality of center trenches may be covered with an insulating film. With this configuration, a mesa region positioned between the adjacent center trenches becomes a depletion layer upon application of a backward voltage, so that a channel region of the drift layer is pinched off. Thus, a leak current upon application of the backward voltage can be significantly reduced.

In this case, the width of the outer peripheral trench may be larger than the width of the center trench, the depth of the outer peripheral trench may be larger than the depth of the center trench, and the mesa width between the outer peripheral trench and the center trench positioned closest to the outer peripheral trench may be smaller than the mesa width between the plurality of center trenches. With this configuration, concentration of an electric field is further alleviated, making it further unlikely to cause dielectric breakdown.

Advantageous Effects of the Invention

As described above, according to the present invention, there can be provided a Schottky barrier diode using gallium oxide, which is less likely to cause dielectric breakdown due to concentration of an electric field.

MODE FOR CARRYING OUT THE INVENTION

Preferred embodiments of the present invention will be explained below in detail with reference to the accompanying drawings.

First Embodiment

Figure 1:
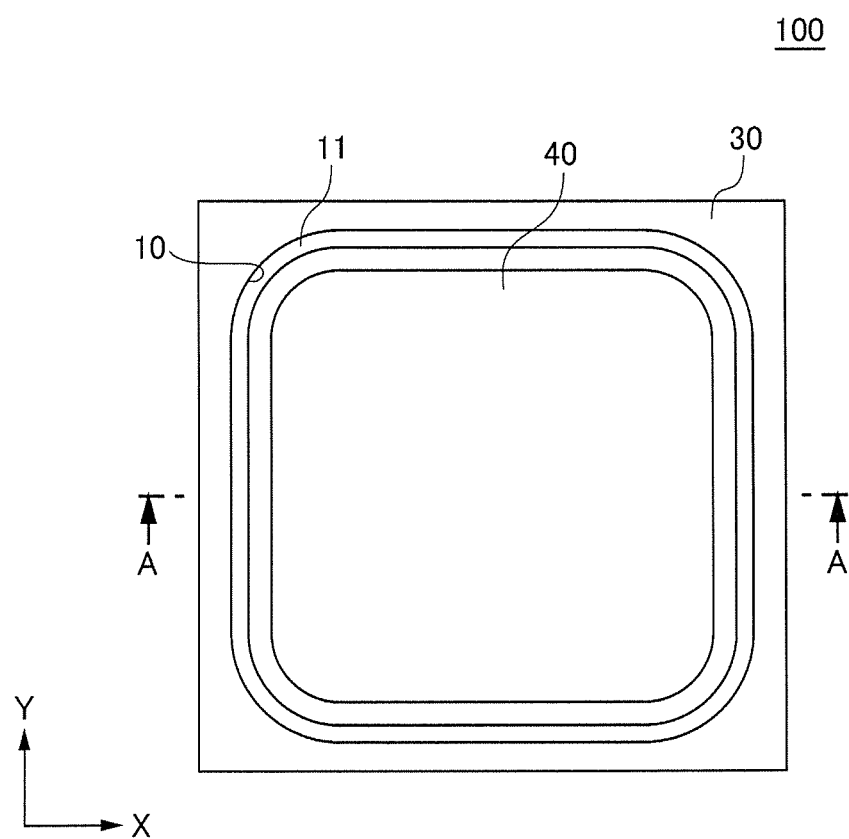
FIG. 1 is a top view illustrating the configuration of a Schottky barrier diode 100 according to a first embodiment of the present invention.
Figure 2:
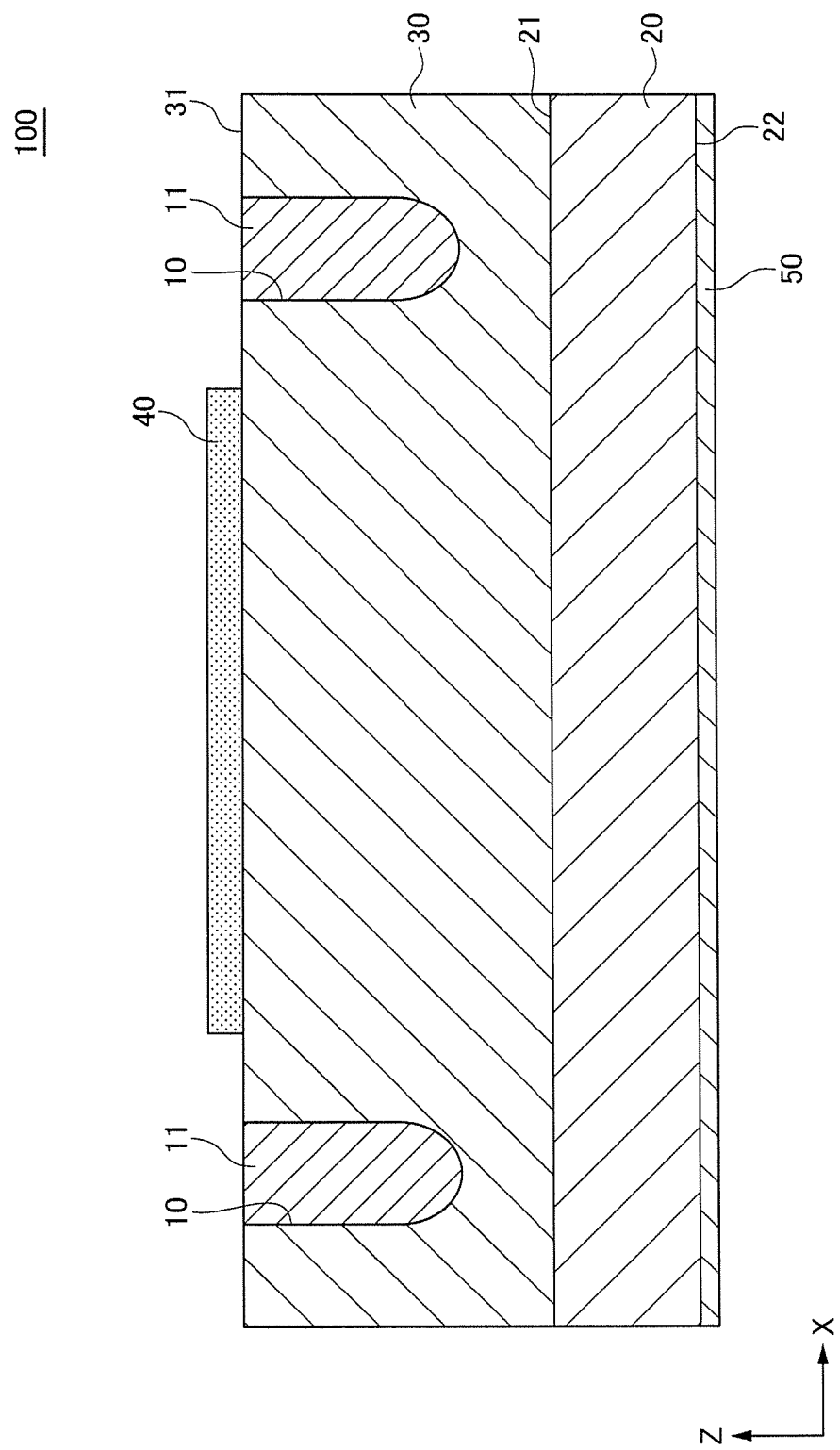
FIG. 2 is a cross-sectional view taken along line A-A in FIG. 1.

FIG. 1 is a top view illustrating the configuration of a Schottky barrier diode 100 according to the first embodiment of the present invention. FIG. 2 is a cross-sectional view taken along line A-A in FIG. 1.

As illustrated in FIGS. 1 and 2, the Schottky barrier diode 100 according to the present embodiment has a semiconductor substrate 20 and a drift layer 30, both of which are made of gallium oxide ($\beta$-$Ga_2O_3$). The semiconductor substrate 20 and drift layer 30 are each introduced with silicon (Si) or tin (Sn) as an n-type dopant. The concentration of the dopant is higher in the semiconductor substrate 20 than in the drift layer 30, whereby the semiconductor substrate 20 and the drift layer 30 function as an $n^+$ layer and an n-layer, respectively.

The semiconductor substrate 20 is obtained by cutting a bulk crystal formed using a melt-growing method, and the thickness (height in the Z-direction) thereof is about 250 μm. Although there is no particular restriction on the planar size of the semiconductor substrate 20, the planar size is generally selected in accordance with the amount of current flowing in the element and, when the maximum amount of forward current is about 20 A, the widths in the X- and Y-directions may be set to about 2.4 mm.

The semiconductor substrate 20 has an upper surface 21 positioned on the upper surface side in a mounted state and a back surface 22 positioned on the lower surface side in a mounted state. The drift layer 30 is formed on the entire upper surface 21. The drift layer 30 is a thin film obtained by epitaxially growing gallium oxide on the upper surface 21 of the semiconductor substrate 20 using a reactive sputtering method, a PLD method, an MBE method, an MOCVD method, or an HVPE method. Although there is no particular restriction on the film thickness of the drift layer 30, the film thickness is generally selected in accordance with the backward withstand voltage of the element and, in order to ensure a withstand voltage of about 600 V, the film thickness may be set to, e.g., about 7 m.

An anode electrode 40 brought into Schottky contact with the drift layer 30 is formed on an upper surface 31 of the drift layer 30. The anode electrode 40 is formed of metal such as platinum (Pt), palladium (Pd), gold (Au), nickel (Ni), or the like. The anode electrode 40 may have a multilayer structure of different metal films, such as Pt/Au, Pt/Al, Pd/Au, Pd/Al, Pt/Ti/Au, or Pd/Ti/Au. On the other hand, a cathode electrode 50 brought into ohmic contact with the semiconductor substrate 20 is formed on the back surface 22 of the semiconductor substrate 20. The cathode electrode 50 is formed of metal such as titanium (Ti). The cathode electrode 50 may have a multilayer structure of different metal films, such as Ti/Au or Ti/Al.

The drift layer 30 has formed therein an outer peripheral trench 10 at a position not overlapping the anode electrode 40 in a plan view (as viewed in the Z-direction) so as to surround the anode electrode 40. The outer peripheral trench 10 can be formed by etching the drift layer 30 from the upper surface 31 side.

The outer peripheral trench 10 is formed for alleviating an electric field concentrating on the end portion of the anode electrode 40. In the present embodiment, the inside of the outer peripheral trench 10 is filled with an insulator 11. In the present invention, the inside of the outer peripheral trench 10 may not necessarily be filled with the insulator 11 and may be left hollow, or may be filled partially or wholly with a conductor. However, when the inside of the outer peripheral trench 10 is filled with a conductor, the conductor needs to be electrically isolated from the anode electrode 40. When the inside of the outer peripheral trench 10 is filled with the insulator 11, an electric field dispersion effect can be enhanced as compared to when the inside of the outer peripheral trench 10 is left hollow.

As described above, in the Schottky barrier diode 100 according to the present embodiment, the outer peripheral trench 10 is formed in the drift layer 30, so that an electric field concentrating on the end portion of the anode electrode 40 is alleviated by the outer peripheral trench 10. This can prevent dielectric breakdown due to concentration of an electric field.

Second Embodiment

Figure 3:
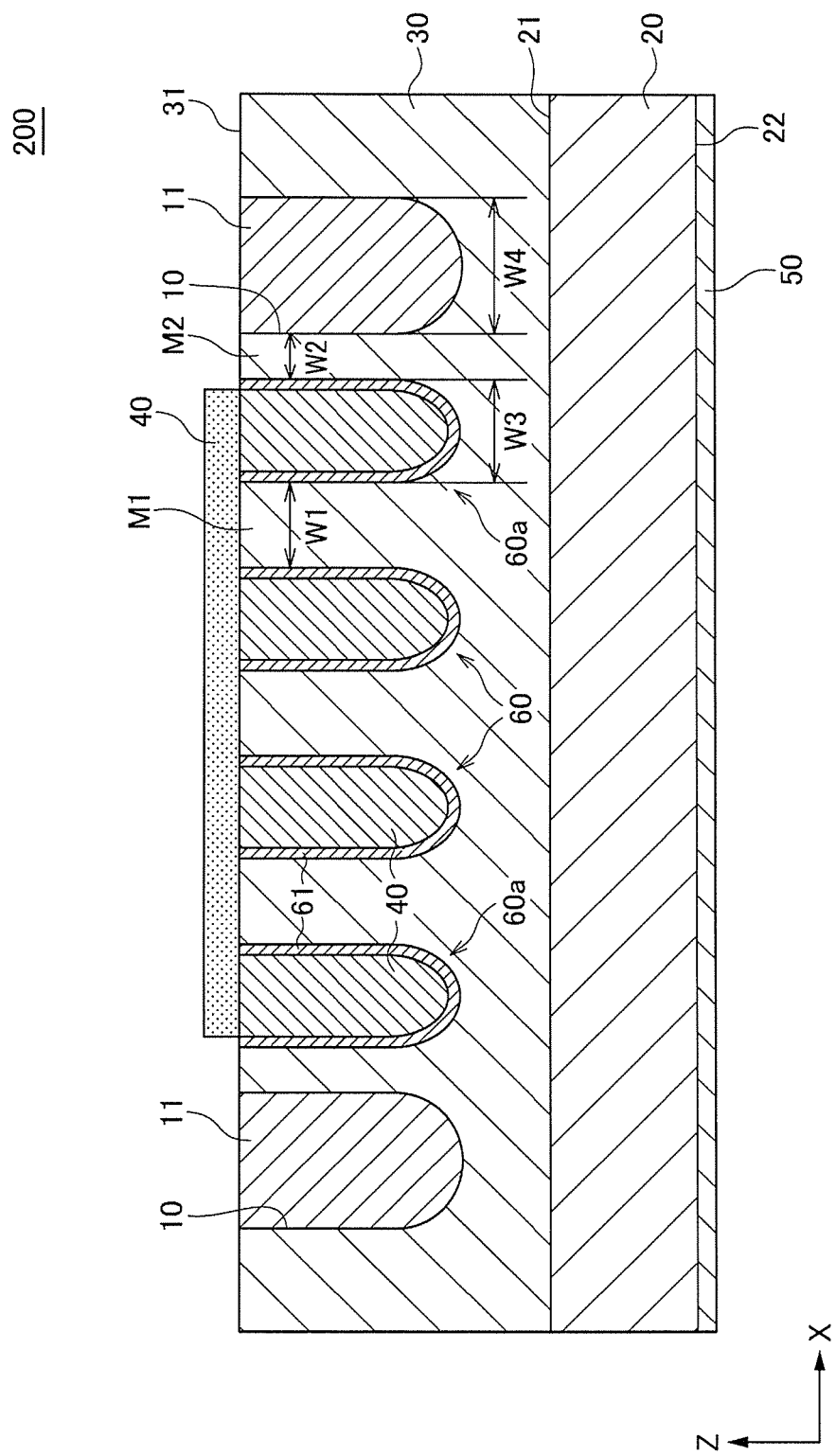
FIG. 3 is a cross-sectional view illustrating the configuration of a Schottky barrier diode 200 according to a second embodiment of the present invention.

FIG. 3 is a cross-sectional view illustrating the configuration of a Schottky barrier diode 200 according to the second embodiment of the present invention.

As illustrated in FIG. 3, in the Schottky barrier diode 200 according to the second embodiment, a plurality of center trenches 60 are formed in the drift layer 30. The center trenches 60 are all formed at a position overlapping the anode electrode 40 in a plan view. The inner wall of each of the center trenches 60 is covered with an insulating film 61 made of $HfO_2$ or the like. The inside of each center trench 60 is filled with the same material the anode electrode 40. When the center trenches 60 are formed as in the present embodiment, the anode electrode 40 may be made of a material having a low working function, such as molybdenum (Mo) or copper (Cu). Further, in the present embodiment, the dopant concentration of the drift layer 30 is increased up to about $5 \times 10^{16}$ $cm^{-3}$. Other configurations are basically the same as those of the Schottky barrier diode 100 according to the first embodiment, so the same reference numerals are given to the same elements, and overlapping description will be omitted.

A part of the drift layer 30 positioned between the adjacent center trenches 60 constitutes a mesa region M1. The mesa region M1 becomes a depletion layer when a backward voltage is applied between the anode electrode 40 and the cathode electrode 50, so that a channel region of the drift layer 30 is pinched off. Thus, a leak current upon application of the backward voltage can be significantly reduced.

In the Schottky barrier diode having such a structure, an electric field concentrates on the bottom portion of a center trench 60a positioned at the end portion, making it likely to cause dielectric breakdown at this portion. However, in the Schottky barrier diode 200 according to the present embodiment, the outer peripheral trench 10 is formed at the outer periphery of the center trenches 60, an electric field concentrating on the center trench 60a at the end portion is alleviated.

As illustrated in FIG. 3, a part of the drift layer 30 positioned between the center trench 60a at the end portion and the outer peripheral trench 10 constitutes a mesa region M2. Although there is no particular restriction on the relationship between a mesa width W1 of the mesa region M1 and a mesa width W2 of the mesa region M2, W1≥W2 is preferably satisfied, and W1>W2 is more preferably satisfied.

This is because that the mesa width W1 of the mesa region M1 needs to be ensured to some extent in order to reduce on-resistance and that the smaller the mesa width W2 of the mesa region M2 is, the higher the electric field dispersion effect becomes. However, the lower limit of the mesa width W2 of the mesa region M2 is restricted by processing accuracy.

Although there is also no particular restriction on the relationship between a width W3 of the center trench 60 and a width W4 of the outer peripheral trench 10, W3≤W4 is preferably satisfied, and W3<W4 is more preferably satisfied.

This is because that the width W3 of the center trench 60 needs to be reduced to some extent in order to reduce on-resistance and that the larger the width W4 of the outer peripheral trench 10 is, the higher the electric field dispersion effect becomes.

As described above, the Schottky barrier diode 200 according to the present embodiment has an effect that can reduce a leak current upon application of a backward voltage, in addition to the effect obtained by the Schottky barrier diode 100 according to the first embodiment. Further, in the present embodiment, the outer peripheral trench 10 and the center trench 60 have the same depth, and thus, they can be formed in the same process.

Further, although the inner wall of the center trench 60 is covered with the insulating film 61, and the inside thereof is filled with the same material as the anode electrode 40 in the present embodiment, the inside of the center trench 60 may be filled with a semiconductor material of an opposite conductivity type (p-type, in the present embodiment) without the use of the insulating film 61.

Third Embodiment

Figure 4:
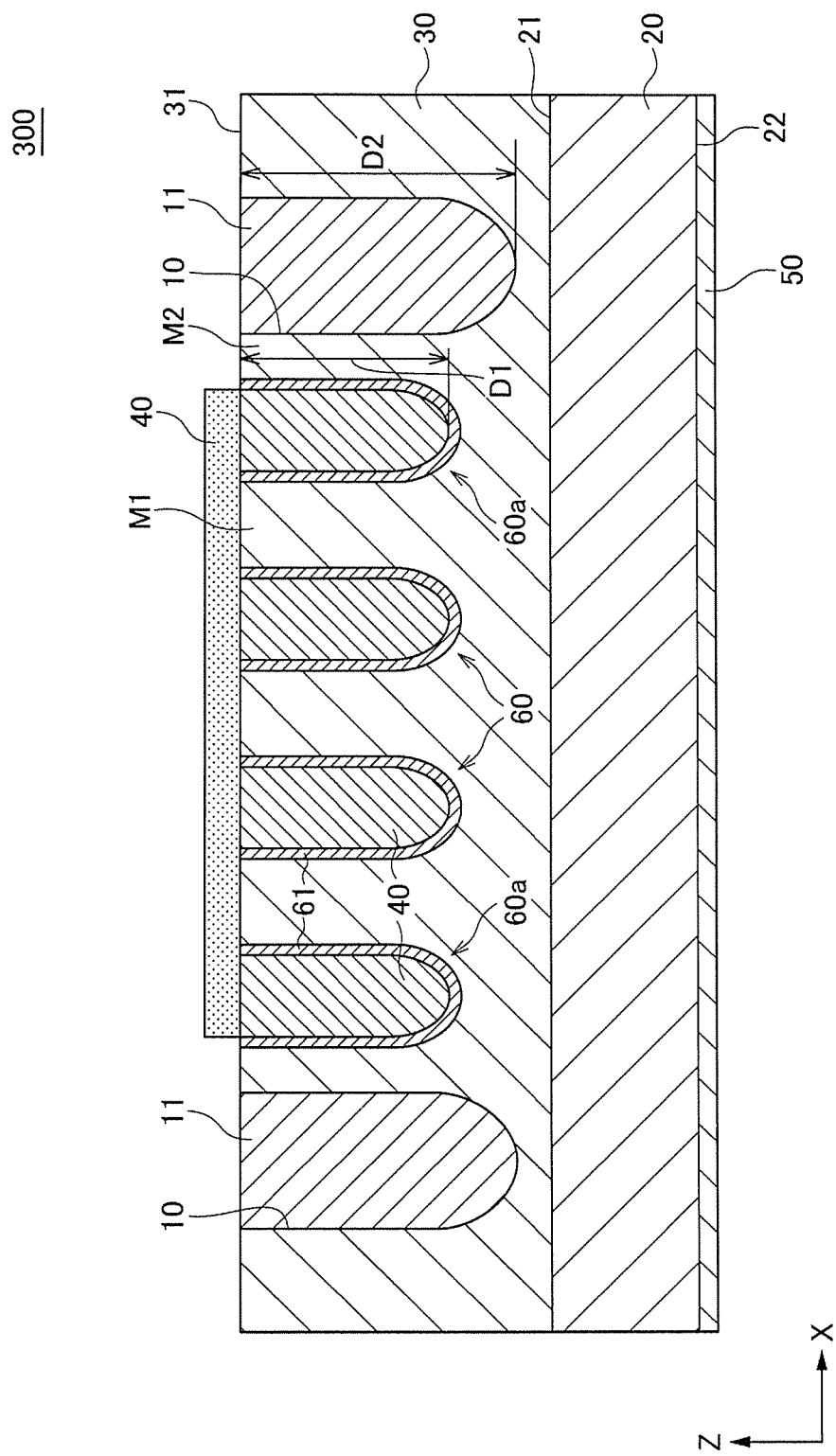
FIG. 4 is a cross-sectional view illustrating the configuration of a Schottky barrier diode 300 according to a third embodiment of the present invention.

FIG. 4 is a cross-sectional view illustrating the configuration of a Schottky barrier diode 300 according to the third embodiment of the present invention.

As illustrated in FIG. 4, in the Schottky barrier diode 300 according to the third embodiment, a depth D2 of the outer peripheral trench 10 is larger than a depth D1 of the center trench 60. Other configurations are basically the same as those of the Schottky barrier diode 200 according to the second embodiment, so the same reference numerals are given to the same elements, and overlapping description will be omitted.

When the depth D2 of the outer peripheral trench 10 is small, the electric field dispersion effect cannot sufficiently be obtained; however, by making the depth D2 of the outer peripheral trench 10 larger than the depth D1 of the center trench 60, the electric field dispersion effect can be enhanced.

It is apparent that the present invention is not limited to the above embodiments, but may be modified and changed without departing from the scope and spirit of the invention.

Example 1

A simulation model of example 1 having the same configuration as the Schottky barrier diode 100 illustrated in FIGS. 1 and 2 was assumed, and electric field strength was simulated with a backward voltage applied between the anode electrode 40 and the cathode electrode 50. The dopant concentration of the semiconductor substrate 20 was set to $1 \times 10^{18}$ cm$^{-3}$, and the dopant concentration of the drift layer 30 was to $1 \times 10^{16}$ cm$^{-3}$. The thickness of the drift layer 30 was set to 7 µm. For comparison, a simulation model of comparative example 1 having a structure obtained by removing the outer peripheral trench 10 and insulator 11 from the simulation model of example 1 was assumed, and electric field strength was simulated with a backward voltage applied between the anode electrode 40 and the cathode electrode 50.

Figure 5:
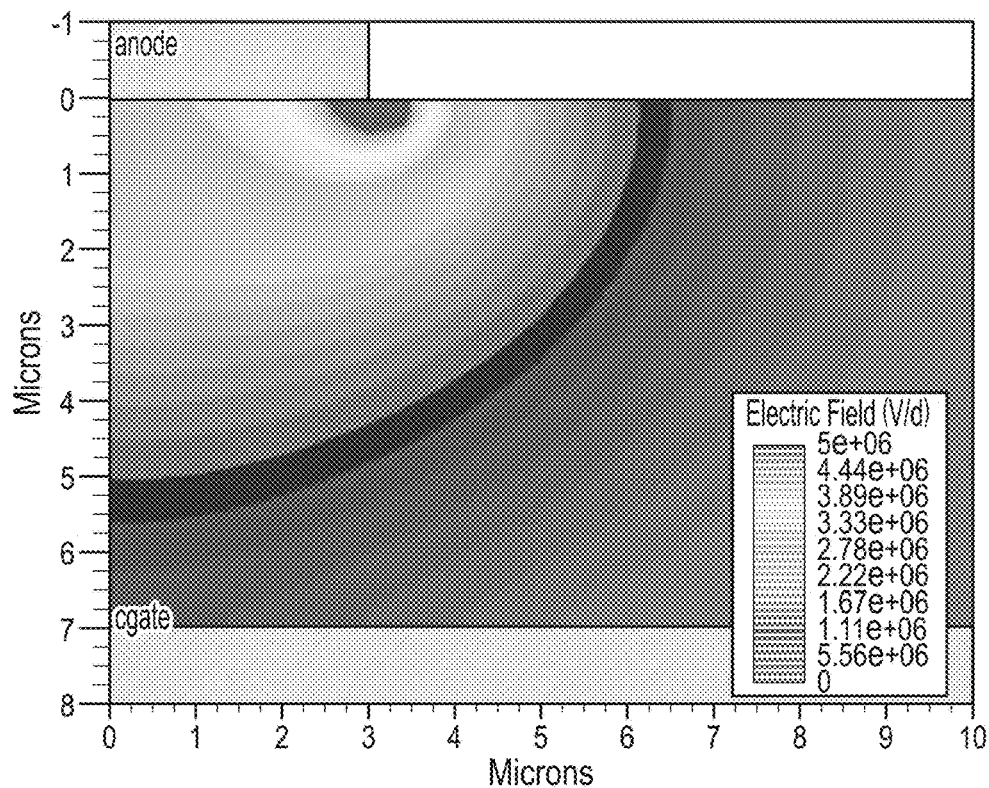
FIG. 5 is a view illustrating the simulation result of comparative example 1.

FIG. 5 is a view illustrating the simulation result of comparative example 1. In the simulation model of comparative example 1, an electric field concentrated on the corner of the anode electrode 40, and the maximum value thereof was 8.3 MV/cm.

Figure 6:
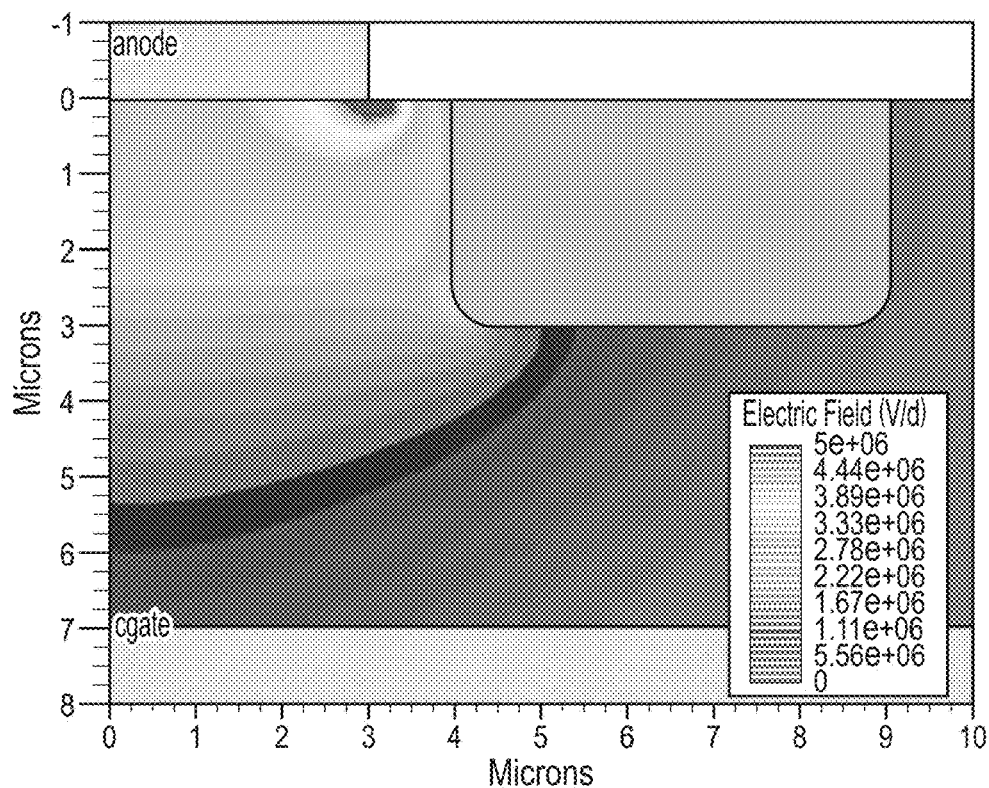
FIG. 6 is a view illustrating the simulation result of example 1.

FIG. 6 is a view illustrating the simulation result of example 1. Also in the simulation model of example 1, an electric field concentrated on the corner of the anode electrode 40; however, the electric field was dispersed by the outer peripheral trench 10, with the result that the maximum value thereof was reduced to 6.8 MV/cm.

Example 2

A simulation model of example 2 having the same configuration as the Schottky barrier diode 200 illustrated in FIG. 3 was assumed, and electric field strength was simulated with a backward voltage applied between the anode electrode 40 and the cathode electrode 50. The depth D1 and the width W3 of the center trench 60 were set to 3 µm and 1 µm, respectively, the mesa width W1 of the mesa region M1 was set to 2 µm, and the insulating film 61 formed on the inner wall of the center trench 60 was an HfO$_2$ film having a thickness of 50 nm. On the other hand, the depth D2 and the width W4 of the outer peripheral trench 10 were set to 3 m and 5 µm, respectively, and the mesa width W2 of the mesa region M2 was set to 2 µm. The dopant concentration of the drift layer 30 was set to $5 \times 10^{16}$ cm$^{-3}$. Other conditions are the same as those of the simulation model of example 1.

For comparison, a simulation model of comparative example 2 having a structure obtained by removing the outer peripheral trench 10 and insulator 11 from the simulation model of example 2 was assumed, and electric field strength was simulated with a backward voltage applied between the anode electrode 40 and the cathode electrode 50.

Figure 7:
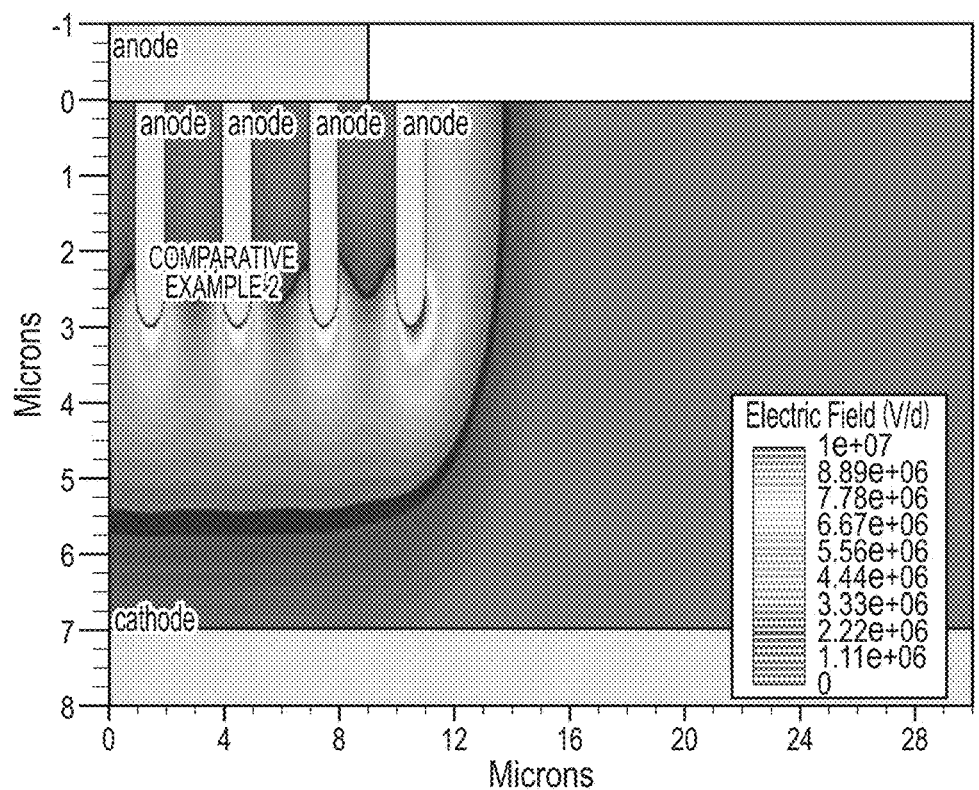
FIG. 7 is a view illustrating the simulation result of comparative example 2.

FIG. 7 is a view illustrating the simulation result of comparative example 2. In the simulation model of comparative example 2, an electric field concentrated on the bottom portion of the center trench 60a positioned at the end portion, and the maximum value thereof was 12.1 MV/cm.

Figure 8:
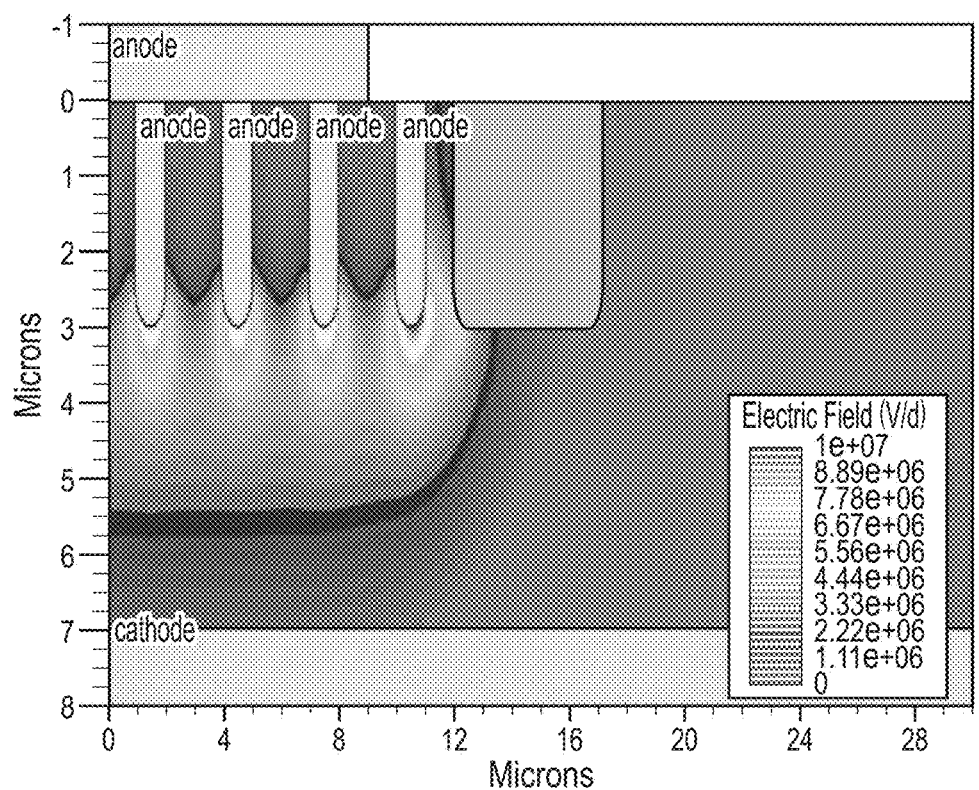
FIG. 8 is a view illustrating the simulation result of example 2.

FIG. 8 is a view illustrating the simulation result of example 2. Also in the simulation model of example 2, an electric field concentrated on the bottom portion of the center trench 60a positioned at the end portion; however, the electric field was dispersed by the outer peripheral trench 10, with the result that the maximum value thereof was reduced to 11.6 MV/cm.

On the other hand, the electric field concentrated to some extent also at the bottom portion of the center trench 60 located at a position other than the end portion; however, no difference was observed between example 2 and comparative example 2, and the maximum values thereof were both 9.4 MV/cm.

Example 3

A simulation model of example 3 having the same configuration as the Schottky barrier diode 300 illustrated in FIG. 4 was assumed, and electric field strength was simulated with a forward voltage applied between the anode electrode and the cathode electrode. In the simulation model of example 3, the depth D2 of the outer peripheral trench 10 was set to 5 μm. Other conditions are the same as those of the simulation model of example 2.

Figure 9:
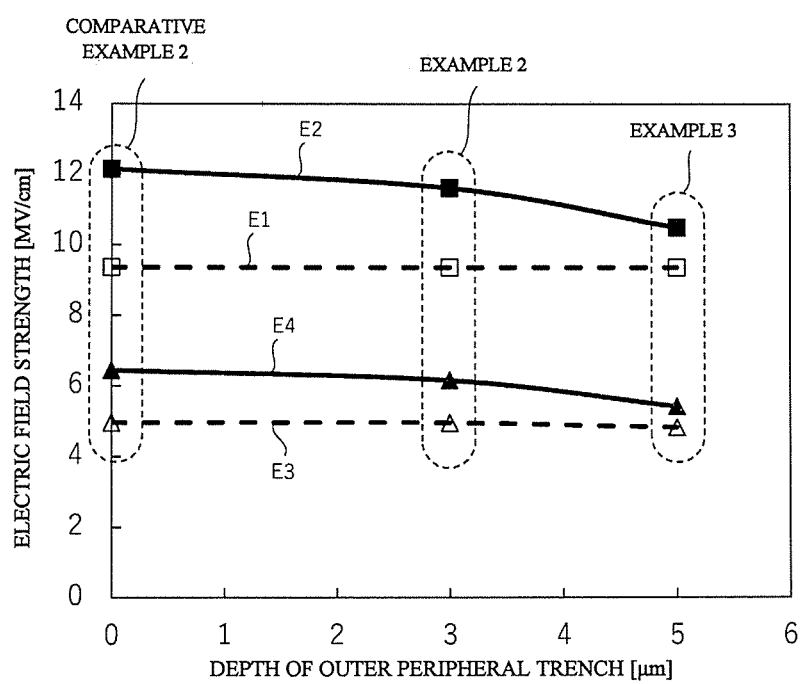
FIG. 9 is a graph illustrating the relationship between the depth of the outer peripheral trench and the electric field strength.

FIG. 9 is a graph illustrating the relationship between the depth of the outer peripheral trench and the electric field strength. In FIG. 9, E1 denotes the maximum electric field applied to the drift layer 30 near the center trench 60 located at a position other than the end portion, E2 denotes the maximum electric field applied to the drift layer 30 near the center trench 60a located at the end portion, E3 denotes the maximum electric field applied to the insulating film 61 covering the inner wall of the center trench 60 located at a position other than the end portion, and E4 denotes the maximum electric field applied to the insulating film 61 covering the inner wall of the center trench 60a located at the end portion.

As illustrated in FIG. 9, the electric field applied to the drift layer 30 and insulating film 61 near the center trench 60a positioned at the end portion was more alleviated as the depth of the outer peripheral trench 10 was increased. On the other hand, the electric field applied to the drift layer 30 and insulating film 61 near the center trench 60 positioned at a position other than the end portion was constant regardless of the depth of the outer peripheral trench 10.

REFERENCE SIGNS LIST 10 peripheral trench
11 insulator
20 semiconductor substrate
21 upper surface of semiconductor substrate
22 back surface of semiconductor substrate
30 drift layer
31 upper surface of the drift layer
40 anode electrode
50 cathode electrode
60 center trench
60a center trench at end portion
61 insulating film
100, 200, 300 Schottky barrier diode
M1, M2 mesa region

What is claimed is:

1. A Schottky barrier diode comprising:
a semiconductor substrate made of gallium oxide;
a drift layer made of gallium oxide and provided on the semiconductor substrate;
an anode electrode that is in Schottky contact with the drift layer; and
a cathode electrode that is in ohmic contact with the semiconductor substrate,
wherein the drift layer has an outer peripheral trench formed at a position surrounding the anode electrode in a plan view,
wherein the outer peripheral trench has a curved bottom surface,
wherein the drift layer further has a plurality of center trenches formed at a position overlapping the anode electrode in a plan view,
wherein a maximum width of the outer peripheral trench is larger than a maximum width of the center trenches, and
wherein the anode electrode does not overlap the outer peripheral trench.

2. The Schottky barrier diode as claimed in claim 1, further comprising an insulator embedded in the outer peripheral trench.

3. The Schottky barrier diode as claimed in claim 1, wherein an inner wall of each of the plurality of center trenches is covered with an insulating film.

4. A Schottky barrier diode comprising:
a semiconductor substrate made of gallium oxide;
a drift layer made of gallium oxide and provided on the semiconductor substrate;
an anode electrode that is in Schottky contact with the drift layer; and
a cathode electrode that is in ohmic contact with the semiconductor substrate,
wherein the drift layer has an outer peripheral trench formed at a position surrounding the anode electrode in a plan view,
wherein the outer peripheral trench has a curved bottom surface,
wherein the drift layer further has a plurality of center trenches formed at a position overlapping the anode electrode in a plan view,
wherein a maximum depth of the outer peripheral trench is larger than a maximum depth of the center trenches, and
wherein the anode electrode does not overlap the outer peripheral trench.

5. A Schottky barrier diode comprising:
a semiconductor substrate made of gallium oxide;
a drift layer made of gallium oxide and provided on the semiconductor substrate;
an anode electrode that is in Schottky contact with the drift layer; and
a cathode electrode that is in ohmic contact with the semiconductor substrate,
wherein the drift layer has an outer peripheral trench formed at a position surrounding the anode electrode in a plan view,
wherein the outer peripheral trench has a curved bottom surface,
wherein the drift layer further has a plurality of center trenches formed at a position overlapping the anode electrode in a plan view,
wherein a mesa width between the outer peripheral trench and one of the center trenches positioned closest to the outer peripheral trench is smaller than a mesa width between the plurality of center trenches, and
wherein the outer peripheral trench is not covered by the anode electrode.

6. The Schottky barrier diode as claimed in claim 1, wherein the outer peripheral trench is filled with an insulating material.

7. The Schottky barrier diode as claimed in claim 1,
wherein the drift layer has a surface including:
- a first surface which is covered with the anode electrode; and
- a second surface which is not covered with the anode electrode, wherein the second surface surrounds the first surface, and
wherein the outer peripheral trench surrounds the second surface.

8. The Schottky barrier diode as claimed in claim 4, wherein the outer peripheral trench is filled with an insulating material.

9. The Schottky barrier diode as claimed in claim 4,
wherein the drift layer has a surface including:
- a first surface which is covered with the anode electrode; and
- a second surface which is not covered with the anode electrode, wherein the second surface surrounds the first surface, and
wherein the outer peripheral trench surrounds the second surface.

10. The Schottky barrier diode as claimed in claim 5, wherein the anode electrode does not overlap the outer peripheral trench.

11. The Schottky barrier diode as claimed in claim 10,
wherein the drift layer has a surface including:
- a first surface which is covered with the anode electrode; and
- a second surface which is not covered with the anode electrode, wherein the second surface surrounds the first surface, and
wherein the outer peripheral trench surrounds the second surface.

12. The Schottky barrier diode as claimed in claim 5, wherein the outer peripheral trench is filled with an insulating material.

* * * * *